United States Patent
Sakaue et al.

(10) Patent No.: US 10,872,797 B2
(45) Date of Patent: Dec. 22, 2020

(54) SUBSTRATE PROCESSING APPARATUS AND METHOD OF OPERATING SUBSTRATE PROCESSING APPARATUS

(71) Applicant: TOKYO ELECTRON LIMITED, Tokyo (JP)

(72) Inventors: Hiromitsu Sakaue, Nirasaki (JP); Junpei Sasaki, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 188 days.

(21) Appl. No.: 16/224,952

(22) Filed: Dec. 19, 2018

(65) Prior Publication Data
US 2019/0198369 A1    Jun. 27, 2019

(30) Foreign Application Priority Data
Dec. 22, 2017    (JP) ................................ 2017-246820

(51) Int. Cl.
| | |
|---|---|
| *B25J 18/04* | (2006.01) |
| *B25J 9/10* | (2006.01) |
| *H01L 21/677* | (2006.01) |
| *H01L 21/67* | (2006.01) |
| *H01L 21/68* | (2006.01) |

(52) U.S. Cl.
CPC ........ *H01L 21/67742* (2013.01); *B25J 9/107* (2013.01); *B25J 18/04* (2013.01); *H01L 21/6776* (2013.01); *H01L 21/67259* (2013.01); *H01L 21/67748* (2013.01); *H01L 21/681* (2013.01)

(58) Field of Classification Search
CPC ............ B25J 18/04; B25J 9/10; H01L 21/677
See application file for complete search history.

(56) References Cited

U.S. PATENT DOCUMENTS

| | | | | |
|---|---|---|---|---|
| 7,457,680 | B2 * | 11/2008 | Akiyama | .......... H01L 21/67775 700/112 |
| 9,684,014 | B2 * | 6/2017 | Akiyama | ........... G01R 1/07364 |
| 2001/0002447 | A1 * | 5/2001 | Kawamatsu | .......... H01L 21/681 700/229 |

(Continued)

FOREIGN PATENT DOCUMENTS

| | | |
|---|---|---|
| JP | 2012061568 A | 3/2012 |
| JP | 2013042112 A | 2/2013 |

*Primary Examiner* — Kira Nguyen
(74) *Attorney, Agent, or Firm* — Nath, Goldberg & Meyer; Jerald L. Meyer

(57) ABSTRACT

A substrate processing apparatus, includes: a substrate transfer mechanism configured to advance and retreat a holding body that holds a substrate by symmetrically arranging two link mechanisms each including a driving arm and a driven arm; a processing module; a rotation angle measuring part configured to measure a rotation angle the driving arms; a holding body detection part configured to detect that a specific portion of the holding body is located at a predetermined position; and a controller configured to execute a step of acquiring a measurement value of the rotation angle of the driving arm, a step of obtaining a moving average of the measurement value of the rotation angle, and a step of obtaining a correction amount of the rotation angle so that a substrate transfer position of the holding body of the substrate transfer mechanism for the processing module becomes a reference position.

7 Claims, 10 Drawing Sheets

(56) References Cited

U.S. PATENT DOCUMENTS

| | | | |
|---|---|---|---|
| 2004/0075822 A1* | 4/2004 | Hattori | G03F 7/7075 |
| | | | 355/72 |
| 2011/0139333 A1* | 6/2011 | Yamamoto | H01L 21/67132 |
| | | | 156/64 |
| 2016/0133502 A1* | 5/2016 | Won | H01L 21/68707 |
| | | | 700/253 |

* cited by examiner

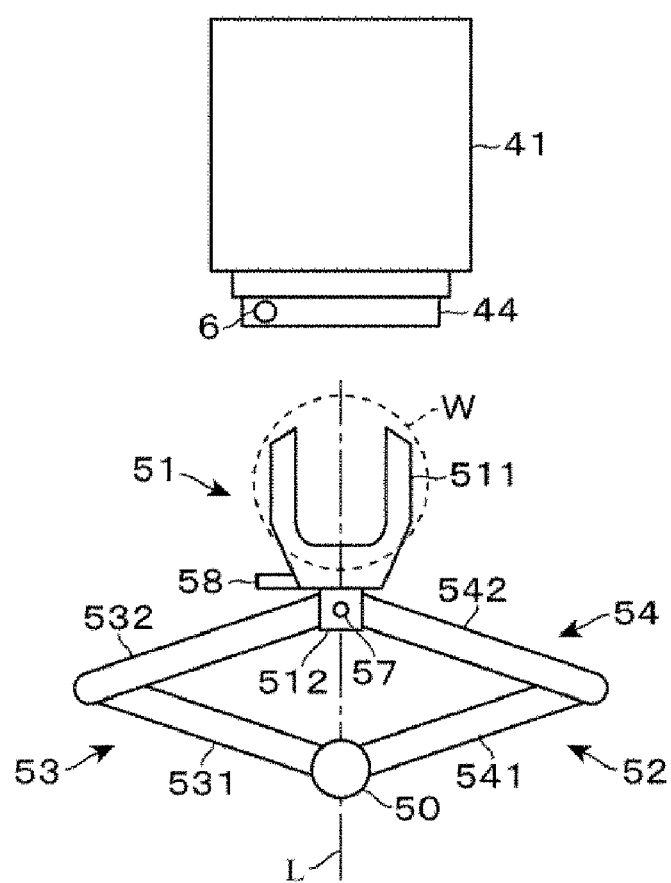

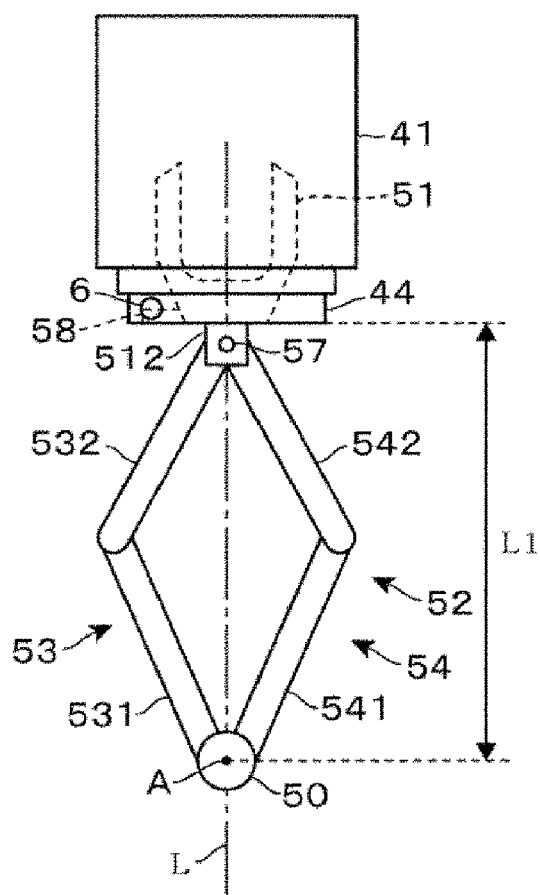

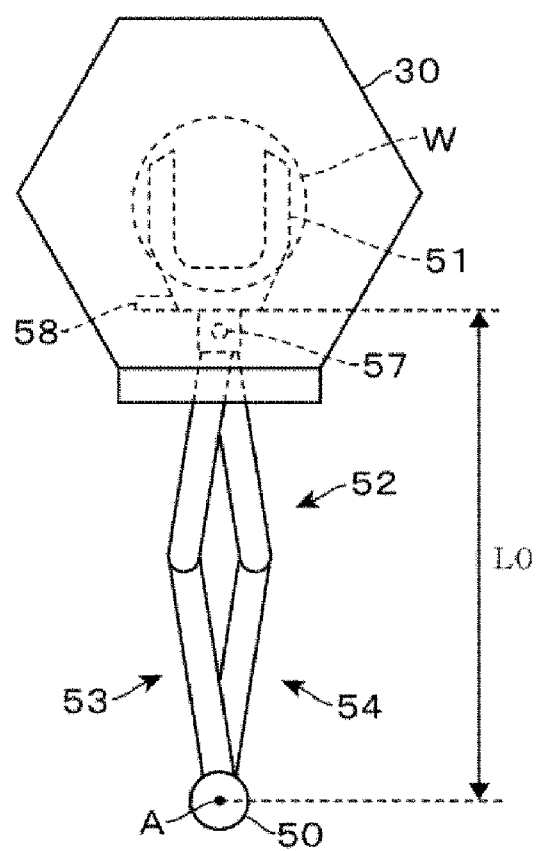

SUBSTRATE PROCESSING APPARATUS AND METHOD OF OPERATING SUBSTRATE PROCESSING APPARATUS

CROSS-REFERENCE TO RELATED APPLICATION

This application is based on and claims the benefit of priority from Japanese Patent Application No. 2017-246820, filed on Dec. 22, 2017, the entire contents of which are incorporated herein by reference.

TECHNICAL FIELD

The present disclosure relates to a substrate processing apparatus for transferring a substrate to a processing module by a substrate transfer mechanism and processing the substrate in a heated state in the processing module, and a method of operating the substrate processing apparatus.

BACKGROUND

In a process of manufacturing a semiconductor device, for example, a liquid crystal panel or the like, various processes such as a film forming process, an etching process, an oxidation process and the like on a substrate, such as a semiconductor substrate or a liquid crystal substrate, are carried out in separate processing containers. When carrying the substrate into and out of the processing container, conventionally, a transfer device having a holding member for holding the substrate is used. As a conventional technique, a so-called frog-leg type multi-joint arm having a configuration in which driving arms to which link arms are connected are bilaterally symmetrically arranged is known. This frog-leg type multi-joint arm has a configuration that does not use a timing belt, and is suitable for vacuum processing or heat treatment.

When carrying the substrate into and out of the processing container, since the transfer device is exposed to heat in the processing container and thus thermally expanded, it is necessary to acquire position information of the transfer device and to perform positioning on the transfer position of the substrate in the processing container. In particular, aluminum is generally used as a material of the arm in terms of weight reduction and versatility, and the coefficient of thermal expansion is larger than that of the holding member made of ceramic or the like. Therefore, it is regarded that it is important to consider elongation or strain of the arm for the positioning.

Various positioning techniques have been devised in order to transfer the substrate to a desired position in the processing container using the transfer device having the holding member. As another conventional technique, there is known a technique in which a substrate is carried into a vacuum processing unit by calculating a position deviation of the substrate from a reference position at a room temperature and correcting the position deviation, in a configuration in which the substrate is carried into the vacuum processing unit that performs heat treatment by a one-arm type multi-joint arm supporting a holding member by one arm. Thus, since the position deviation caused by the thermal expansion of the multi-joint arm or the holding member may be corrected, the position accuracy of the substrate is improved.

However, the transfer arm used in the conventional technique is an one-arm type multi-joint arm, and the positioning of a transfer device having a frog-leg type double-arm type arm that supports a holding member by two link mechanisms that are bilaterally symmetrical is not currently performed in consideration of its shape.

SUMMARY

The present disclosure provides some embodiments of a technique of transferring a substrate to a transfer position of the substrate in a processing module with high accuracy, in a substrate processing apparatus which transfers the substrate to the processing module by a so-called frog-leg type substrate transfer mechanism in which two link mechanisms including a driving arm and a driven arm are bilaterally symmetrically arranged, and processes the substrate in a heated state in the processing module.

According to one embodiment of the present disclosure, there is provided a substrate processing apparatus, including: a substrate transfer mechanism configured to advance and retreat a holding body that holds a substrate by bilaterally symmetrically arranging two link mechanisms each including a driving arm and a driven arm connected to each other so as to horizontally rotate, connecting the holding body at a leading end of each of the driven arms of the link mechanisms so that the holding body horizontally rotates, and horizontally rotating the driving arms synchronously by a driving part; a processing module configured to process the substrate in a heated state, the substrate being transferred by the substrate transfer mechanism; a rotation angle measuring part configured to measure a rotation angle of at least one of the driving arms; a holding body detection part configured to detect that a specific portion of the holding body is located at a predetermined position; and a controller configured to execute a step of acquiring a measurement value of the rotation angle of at least one of the driving arms when the specific portion is detected by the holding body detection part by positioning the specific portion of the holding body at the predetermined position at preset time intervals, a step of obtaining a moving average of a preset sampling number for the measurement value of the rotation angle based on time series data of the measurement value of the rotation angle acquired in the step of acquiring the measurement value, and a step of obtaining a correction amount of the rotation angle of at least one of the driving arms obtained in advance so that a substrate transfer position of the holding body of the substrate transfer mechanism for the processing module becomes a reference position, according to a comparison result between a value of the moving average and a value of a reference rotation angle which is a rotation angle of at least one of the driving arms when the specific portion of the holding body of the substrate transfer mechanism at a reference temperature is located at the predetermined position.

According to one embodiment of the present disclosure, there is provided a method of operating a substrate processing apparatus including a substrate transfer mechanism configured to advance and retreat a holding body that holds a substrate by bilaterally symmetrically arranging two link mechanisms each including a driving arm and a driven arm connected to each other so as to horizontally rotate, connecting the holding body at a leading end of each of the driven arms of the mechanisms so that the holding body horizontally rotates, and horizontally rotating the driving arms synchronously by a driving part; and a processing module configured to process the substrate in a heated state, the substrate being transferred by the substrate transfer mechanism, the method including: acquiring a measurement value of a rotation angle of at least one of the driving arms when a specific portion of the holding body is detected by a holding body detection part by positioning the specific portion of the holding body at the predetermined position at preset time intervals; obtaining a moving average of a preset sampling number for the measurement value of the rotation angle based on time series data of the measurement value of the rotation angle acquired in the step of acquiring the measurement value; and obtaining a correction amount of the rotation angle of at least one of the driving arms obtained in advance so that a substrate transfer position of the holding body of the substrate transfer mechanism for the processing module becomes a reference position, according to a comparison result between a value of the moving average and a value of a reference rotation angle which is a rotation angle of at least one of the driving arms when the specific portion of the holding body of the substrate transfer mechanism at a reference temperature is located at the predetermined position.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 3A to 3C are plan views illustrating an operation of the substrate transfer mechanism.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described with reference to detail so as not to unnecessarily obscure aspects of the various embodiments.

Figure 1:
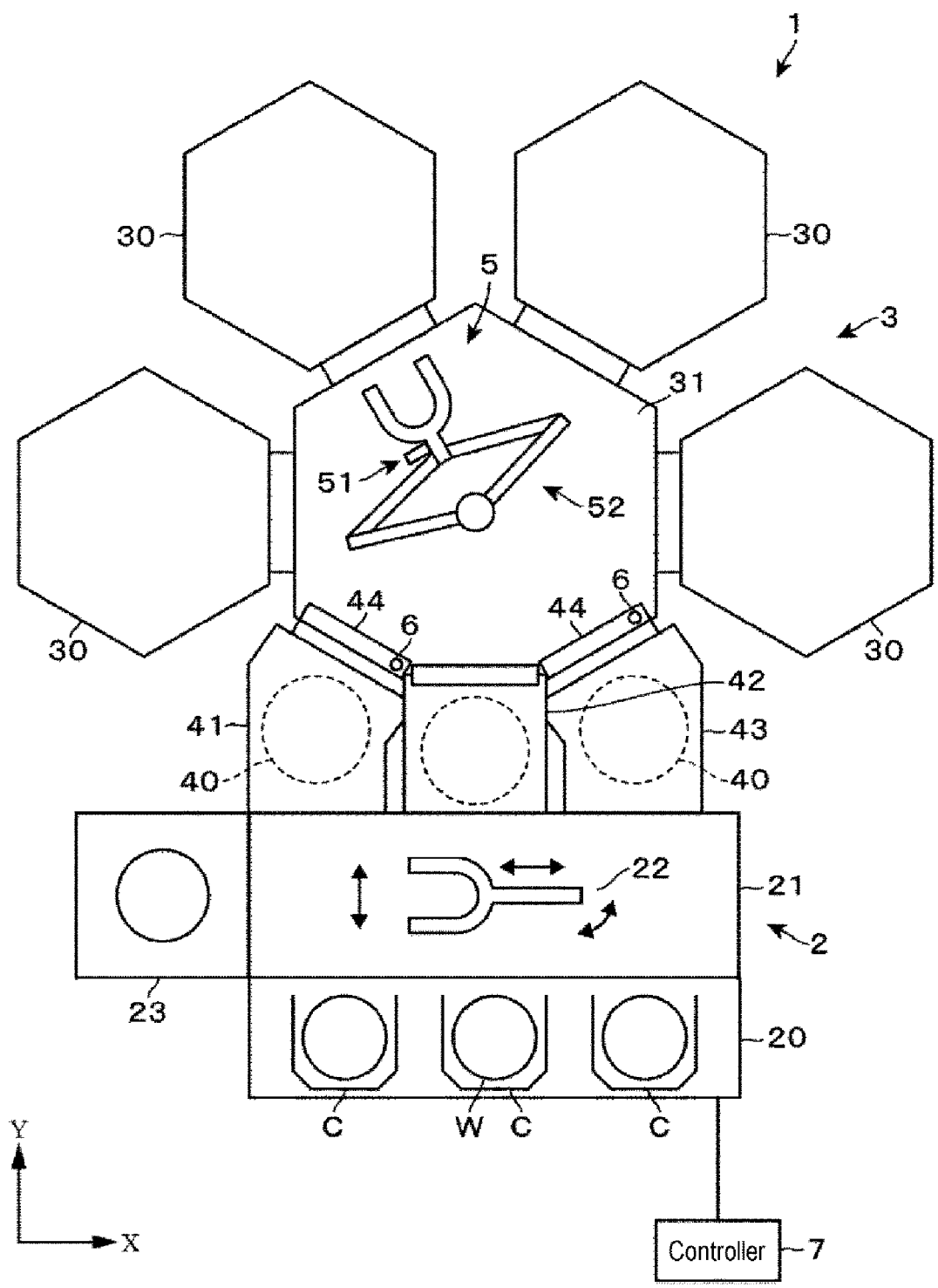
FIG. 1 is a plan view illustrating an embodiment of a substrate processing apparatus.

Embodiments of the present disclosure will now be described with reference to the drawings. Further, in the present specification and the drawings, components having substantially like configuration are given like reference numerals and a repeated description thereof will be omitted. FIG. 1 is a plan view illustrating an embodiment of a substrate processing apparatus 1 of the present disclosure.

The substrate processing apparatus 1 has a cassette station 2 for loading and unloading a substrate, for example, a semiconductor wafer (hereinafter, referred to as a "wafer") W, in units of cassette C, and a processing station 3 for processing the wafer W. The cassette station 2 and the processing station 3 are configured to be integrally connected via load lock chambers 41 to 43. The load lock chambers 41 to 43 are configured to be switched between a normal pressure atmosphere and a vacuum atmosphere, and have loading parts 40 on which the wafer W is loaded.

The cassette station 2 includes a cassette loading part 20, and a transfer chamber 21 installed adjacent to the cassette loading part 20. For example, a plurality of (e.g., three) cassettes C, each capable of accommodating a plurality of wafers W, may be arranged and loaded on the cassette loading part 20 in an X direction (left and right direction in FIG. 1). A wafer transfer arm 22 configured to be moved vertically and horizontally and moved around a vertical axis is installed in the transfer chamber 21. An alignment device 23 for positioning the wafer W by recognizing a notch or the like of the wafer W is installed at an end portion on a negative direction side of the transfer chamber 21 in the X direction. The wafer transfer arm 22 is configured to transfer the wafer W between the cassettes C of the cassette loading part 20, the load lock chambers 41 to 43, and the alignment device 23.

The processing station 3 includes a plurality of (e.g., four) processing modules 30 for processing the wafer W, and a vacuum transfer chamber 31 having a polygonal shape (hexagonal shape in an example shown). Each of the processing modules 30 loads the wafer W on a loading table (not shown) and performs vacuum processing on the wafer W in a heated state. The processing modules 30 are arranged so as to surround the circumference of the vacuum transfer chamber 31, and are each airtightly connected to the vacuum transfer chamber 31. Furthermore, the vacuum transfer chamber 31 is airtightly connected to the load lock chambers 41 to 43.

A substrate transfer mechanism 5 for transferring the wafer W is installed inside the vacuum transfer chamber 31. The substrate transfer mechanism 5 has a fork 51 as a holding body for holding the wafer W, and a rotatable and expandable arm mechanism 52, and is configured to transfer the wafer W between the load lock chambers 41 to 43, the vacuum transfer chamber 31, and the processing modules 30. In FIG. 1, a case where only one arm mechanism 52 is installed at the center of the vacuum transfer chamber 31 is illustrated, but a plurality of arm mechanisms 52 may also be installed.

Figure 2:
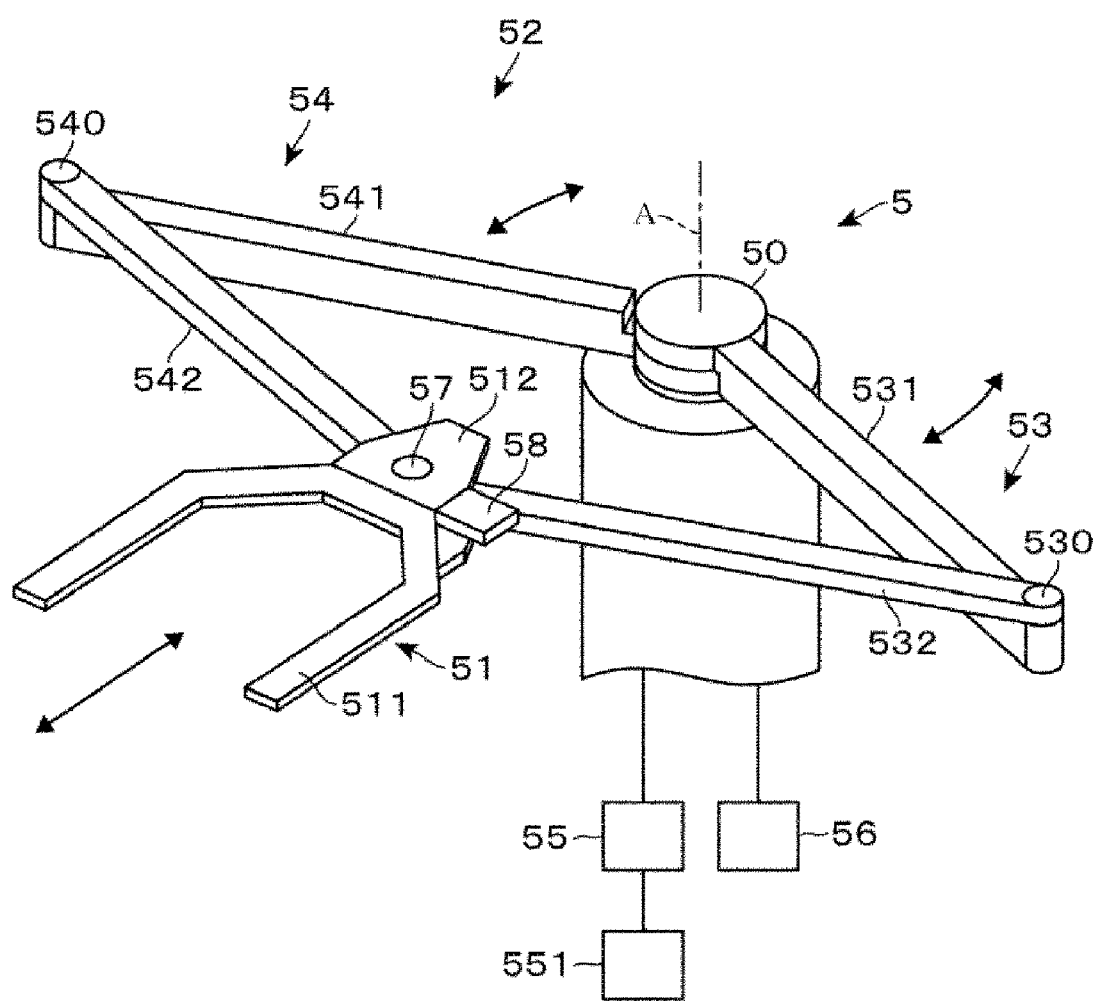
FIG. 2 is a perspective view illustrating an embodiment of a substrate transfer mechanism installed in the substrate processing apparatus.

Hereinafter, a detailed configuration of the substrate transfer mechanism 5 will be described with reference to FIG. 2. FIG. 2 is a schematic perspective view of the substrate transfer mechanism 5. As illustrated in the drawing, the arm mechanism 52 of the substrate transfer mechanism 5 includes a first link mechanism 53 and a second link mechanism 54 each having a center A of a central hub 50 as a rotary shaft. The first link mechanism 53 has a first driving arm 531 and a first driven arm 532 each having a linear shape, and the second link mechanism 54 has a second driving arm 541 and a second driven arm 542 each having a linear shape.

The first driven arm 532 is connected to the first driving arm 531 so as to be horizontally rotatable with each other via a joint part 530 at a leading end of the first driving arm 531. Also, the second driven arm 542 is connected to the second driving arm 541 so as to be horizontally rotatable with each other via a joint part 540 at a leading end of the second driving arm 541. These first link mechanism 53 and second link mechanism 54 are disposed bilaterally symmetrically to each other.

A double shaft having an inner shaft and a hollow outer shaft installed on an outer side of the inner shaft, arranged concentrically with each other, is installed in the central hub 50, and a base end side of the first driving arm 531 is connected to one of the inner shaft and the outer shaft and a base end side of the second driving arm 541 is connected to the other. It is configured such that the first driving arm 531 is rotatably driven by a first motor 55 and the second driving arm 541 is rotatably driven by a second motor 56, each with the center A of the central hub 50 as a rotary shaft. The first motor 55 and the second motor 56 constitute a driving part. In addition, an encoder 551 serving as a rotation angle measuring part is connected to the first motor 55 and is configured to output an encoder value (pulse count value) as a rotation angle to a controller 7 which will be described later. The rotation angle refers to, for example, a rotation angle with respect to a rotation position of the encoder 551 when the substrate transfer mechanism 5 is placed at a home position.

The fork 51 as a holding body is installed at leading ends of the first driven arm 532 and the second driven arm 542. The fork 51 has a substantially U-shaped main body part 511 and a support plate 512 for supporting the main body part 511, in which the main body part 511 is connected to the support plate 512 by a fastening member such as a bolt (not shown). The fork 51 is connected to the leading end of the first driven arm 532 and the leading end of the second driven arm 542 via the support plate 512 so as to be respectively horizontally rotatable. At this time, the first driven arm 532 and the fork 51, and the second driven arm 542 and the fork 51 are respectively connected by a common shaft portion 57.

The substrate transfer mechanism 5 having the arm mechanism 52 of a frog-leg type double arm type is configured by the first link mechanism 53 including the first driving arm 531 and the first driven arm 532 and the second link mechanism 54 including the second driving arm 541 and the second driven arm 542. The fork 51 is made of, e.g., ceramic, and the arm mechanism 52 is made of, e.g., aluminum. In this substrate transfer mechanism 5, the left first driving arms 531 and the right second driving arm 541 are configured to horizontally rotate synchronously by driving the first motor 55 and the second motor 56 so that the fork 51 moves forward and backward.

FIG. 3A illustrates the simplified load lock chamber 41 and a state in which the substrate transfer mechanism 5 is contracted, and FIG. 3B illustrates a state in which the substrate transfer mechanism 5 is expanded. When the first and second driving arms 531 and 541 are horizontally rotated in opposite directions from an initial state in which the substrate transfer mechanism 5 is contracted, the frog-leg type arm mechanism 52 is expanded and the fork 51 moves forward. Furthermore, an advancing/retreating amount (advancing/retreating distance) from the center A of the central hub 50 is determined according to a rotation angle of the first and second driving arms 531 and 541. In addition, in the initial state illustrated in FIG. 3A, when the first and second driving arms 531 and 541 are rotated in the same direction, the fork 51 rotates around the central hub 50 while keeping the radial position constant. The center A of the central hub 50 corresponds to the rotation center of the substrate transfer mechanism 5.

For example, as illustrated in FIGS. 3A to 3C, the first link mechanism 53 and the second link mechanism 54 are moved to be symmetrical to each other with respect to a straight line L connecting the rotation center of the shaft portion 57 and the central hub 50 so as to perform the expansion and contraction motion so that the advancing/retreating direction of the fork 51 is aligned with the straight line L. In this manner, the central hub 50, and the first and second motors 55 and 56 are configured to drive the first driving arm 531 and the second driving arm 541 to be horizontally rotated so as to move the fork 51 forward and backward.

Furthermore, a kicker member 58 is installed at a specific portion of the fork 51 in the substrate transfer mechanism 5. The kicker member 58 has a rectangular shape, for example, when viewed from the plane, and is installed on a side surface of the support plate 512 so as to protrude outward at a position that does not interfere with the wafer W when supporting the wafer W on the fork 51.

Figure 4A:
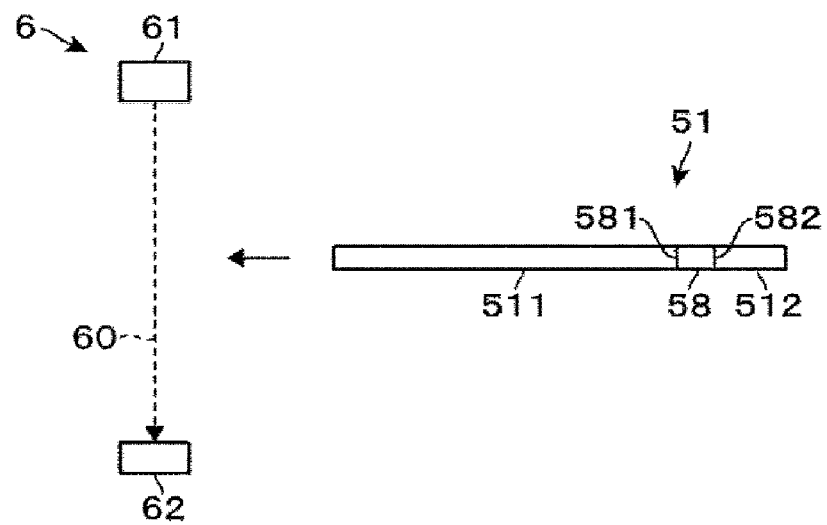
FIGS. 4A and 4B are side views illustrating a holding body detection part, a holding body, and a specific portion.
Figure 4B:
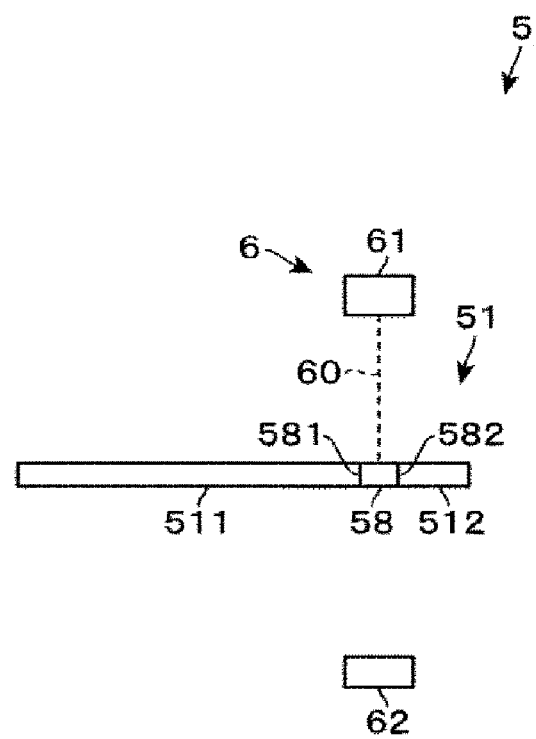

Returning to the substrate processing apparatus 1 and continuing the description, for example, a plurality of (e.g., three) load lock chambers 41 to 43 are installed side by side in a substantially lateral direction. Holding body detection parts 6 are installed in a moving region of the fork 51 when viewed from the plane, for example, at a boundary between the load lock chambers 41 and 43 on both sides in the lateral direction and the vacuum transfer chamber 31, namely in loading/unloading ports 44 that transfer (load and unload) the wafer W to the processing modules 30, so as to detect the kicker member 58. For example, as illustrated in FIGS. 4A and 4B, the holding body detection parts 6 are each formed of a light shielding type optical sensor having, for example, a light emitting part 61 and a light receiving part 62, and one of the light emitting part 61 and the light receiving part 62 is installed above the loading/unloading port 44 and the other is installed below the loading/unloading port 44 so as to form a vertical optical axis 60. In this example, the distance between the holding body detection parts 6 and the rotation center A (the center A of the central hub 50) of the substrate transfer mechanism 5 is set equal to each other between the load lock chamber 41 and the load lock chamber 43.

Figure 5:
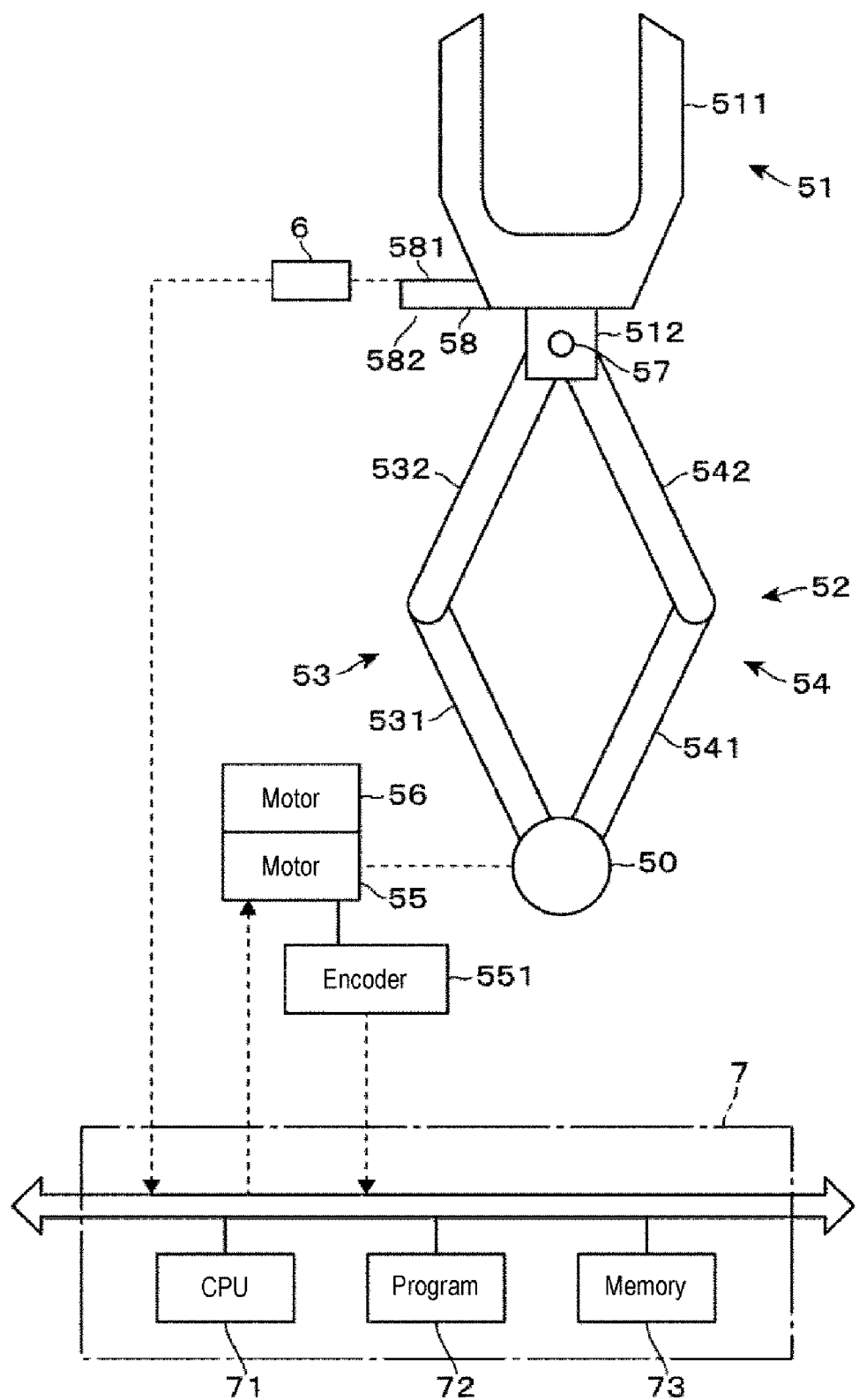
FIG. 5 is a configuration diagram illustrating the substrate transfer mechanism and a controller.

Furthermore, in the description, the timing at which the fork 51 passes through the loading/unloading port 44 of the load lock chambers 41 and 43 and the kicker member 58 blocks the optical axis 60 will be phrased as "a specific portion is located at a predetermined position." In this example, as illustrated in FIGS. 4A and 4B and 5, the kicker member 58 is recognized by measuring two points of an end face 581 ahead of the kicker member 58 in the traveling direction and an end face 582 behind the kicker member 58 in the traveling direction. When the kicker member 58 is recognized in this way, i.e., for example, when the end face 581 blocks the optical axis 60 and detection that the specific portion is located at a predetermined position occurs, for example, an encoder value (pulse count value) of the first motor 55 at this time is acquired as a measurement value of the rotation angle of the driving arm.

In addition, the substrate processing apparatus 1 includes the controller 7. The controller 7 is configured as, e.g., a computer, and for example, as illustrated in FIG. 5, the controller 7 has a CPU 71, a program storage part 72, and a memory 73. A program having commands (a group of steps) assembled to perform vacuum processing and correction of wafer transfer position, which will be described later, is stored in the program storage part 72. The operations of the respective parts of the substrate processing apparatus 1 are controlled by outputting control signals from the controller 7 to the respective parts according to the program. This program is stored in the program storage part, with the program stored in a storage medium such as a hard disk, a compact disc, a magneto optical disc, a memory card or the like.

The program for correcting the transfer position of the wafer W is configured to execute step S1 of acquiring a measurement value of a rotation angle of the driving arm, step S2 of obtaining a moving average of the measurement value of the rotation angle, and step S3 of obtaining a correction amount of the rotation angle of the driving arm according to a value of the moving average. Step S1 is a step of positioning the kicker member 58 (specific portion) of the fork 51 at a predetermined position at preset time intervals, and acquiring a measurement value (hereinafter, referred to as an "encoder value") of the rotation angle of the first driving arm 531 (kicker member) when the kicker member 58 is detected by the holding body detection part 6.

Step S2 is a step of obtaining a moving average of a preset sampling number for the encoder value based on time series data of the encoder value acquired in step S1. Step S3 is a step of obtaining a correction amount of the encoder value of the motor of the driving arm obtained in advance so that the transfer position of the wafer W becomes a reference position according to a result of comparison between a value of the moving average (hereinafter, referred to as a "moving average value") and a reference encoder value which indicates a reference rotation angle. The reference encoder value refers to an encoder value corresponding to the rotation angle of the first driving arm 531 when the kicker member 58 of the fork 51 of the substrate transfer mechanism 5 at a reference temperature, for example, at a room temperature, is positioned to block the optical axis 60.

Furthermore, the reference position refers to a preset transfer position of the wafer W on the fork 51 with respect to the processing module 30 of the substrate transfer mechanism 5 having the reference temperature. Specifically, the reference position means a state where, when the wafer W is held at an appropriate position of the fork 51, the center of the wafer W converges to a permissible horizontal distance range with respect to the center of the loading table of the processing module 30. The substrate transfer mechanism 5 at a room temperature as the reference temperature refers to a state in which there is no history of heating due to the entry of the substrate transfer mechanism 5 into the processing module 30.

In this substrate processing apparatus 1, the wafer W in the cassette C loaded on the cassette loading part 20 is discharged by the wafer transfer arm 22 and is transferred to one of the three load lock chambers 41 to 43. Then, the interior of the load lock chambers 41 to 43 is vacuumed from a normal pressure atmosphere to a vacuum atmosphere, and thereafter, the substrate transfer mechanism 5 of the vacuum transfer chamber 31 receives the wafer W and sequentially transfers the wafer W to the predetermined processing module 30. As will be described later, the substrate transfer mechanism 5 corrects the transfer position of the wafer W on the fork 51 in the processing module 30, and then transfers the wafer W to the processing module 30. In the processing module 30, predetermined vacuum processing is performed in a state in which the wafer W is heated to, e.g., 700 degrees C. The processed wafer W is transferred to one of the three load lock chambers 41 to 43 by the substrate transfer mechanism 5, the load lock chambers 41 to 43 are adjusted from a vacuum atmosphere to a normal pressure atmosphere, and then the wafer W is returned to the cassette C by the transfer arm 22. For example, the atmospheric transfer chamber 21, the load lock chambers 41 to 43, and the vacuum transfer chamber 31 are set at a temperature equal to a room temperature (e.g., 23 degrees C.).

The correction of the transfer position of the wafer W on the fork 51 is carried out according to a change in the length of the arm mechanism 52 of the substrate transfer mechanism 5 as the length thereof changes due to a temperature change. As described above, since the arm mechanism 52 is made of aluminum, the arm is likely to expand due to thermal expansion. When the substrate transfer mechanism 5 is at a room temperature and there is no change in the length of the arm mechanism 52, the encoder values of the first driving arm 531 and the second driving arm 541 when the specific portion of the fork 51 is detected as described above are equal to the preset value (reference encoder value). On the other hand, if there is a change in the length of the arm mechanism 52, the encoder values of the first driving a 531 and the second driving arm 541 when the specific portion is detected will be different from the reference encoder value. As described above, since the first motor 55 and the second motor 56 are synchronously driven to horizontally rotate the first and second driving arms 531 and 541 respectively, it is possible to detect the elongation due to the thermal expansion of the arm mechanism 52 by measuring the rotation angle of the first driving arm 531 when the specific portion is detected.

When the wafer W is transferred to the processing module 30 by the substrate transfer mechanism 5 having the elongation of the arm mechanism 52, the transfer position of the wafer W is displaced from the reference position. The present inventors recognized that in the one-arm type mechanism, the arm elongation rate Gr corresponds to the displacement amount of the wafer W at the arm elongation rate Gr but in the frog-leg type double arm type arm mechanism 52, the arm elongation rate Gr does not necessarily correspond to the displacement amount of the wafer W at the arm elongation rate Gr.

The arm elongation rate Gr is obtained from (measurement value of rotation angle)/(reference rotation angle), and the measurement value of the rotation angle (encoder value) refers to a measurement value of the rotation angle of the first driving arm 531 when the kicker member 58 of the fork 51 of the substrate transfer mechanism 5 is detected by the holding body detection part 6. In addition, the displacement amount of the wafer W refers to a displacement amount of the transfer position of the wafer W from the reference position, and when the substrate transfer mechanism 5 is at the reference temperature, the displacement amount becomes zero.

Figure 6:
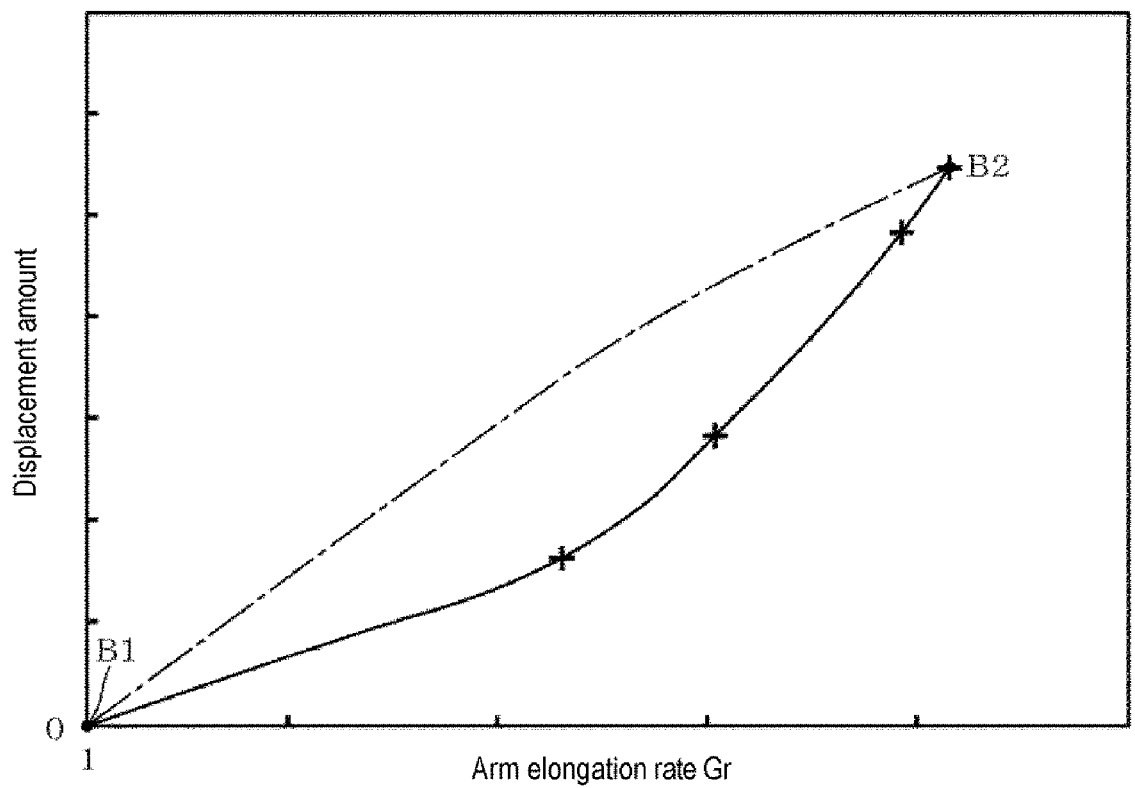
FIG. 6 is a characteristic diagram illustrating a relationship between an arm elongation rate of the substrate transfer mechanism and a displacement amount of a wafer transfer position.

It is considered that the reason for this is that, since there is a phenomenon that the frog-leg type double arm type arm mechanism 52 pushes and pulls the joint parts 530 and 540 by thermal expansion of both arms, extrusion deformation or pull-in deformation occurs, in addition to the elongation due to thermal expansion. Through an actual operation of the substrate transfer mechanism 52, the relationship between the arm elongation rate Gr and the displacement amount when the temperature of the substrate transfer mechanism 5 was raised from the reference temperature (room temperature) was obtained. The result is shown in FIG. 6. In the drawing, the horizontal axis indicates an arm elongation rate Gr and the vertical axis indicates a displacement amount. The actual measurement value when the temperature of the substrate transfer mechanism 5 rises is indicated by plus signs (+), and the simulation result is indicated by a solid line.

When the substrate transfer mechanism 5 is operated, the fork 51 accesses the heated processing module 30, so that the temperature of the substrate transfer mechanism 5 gradually rises to a certain temperature. The actual measurement value is obtained by imaging the substrate transfer mechanism 5. In FIG. 6, reference symbol B1 indicates a time when the substrate transfer mechanism 5 is at a room temperature which is the reference temperature, reference symbol B2 indicates a time when the substrate transfer mechanism 5 is at the highest temperature, and when the temperature of the substrate transfer mechanism 5 rises to the temperature of B2, it converges to this temperature during the operation of the transfer mechanism 5.

Furthermore, the simulation result when the substrate transfer mechanism 5 is in an idling state and the temperature drops is indicated by a one-dot chain line. The idling state means a state in which the substrate processing apparatus 1 is in operation but the substrate transfer mechanism 5 stands by at the home position. In this state, since it is placed in the vacuum transfer chamber 31 of a room temperature, the temperature of the substrate transfer mechanism 5 gradually drops. When the idling state is long, the temperature of the substrate transfer mechanism 5 drops to a room temperature which is the reference temperature, and accordingly, the elongation of the arm is removed. As described above, when the substrate transfer mechanism 5 returns to the room temperature, which is the reference temperature, due to the idling, it becomes a state in which there is no history of heating due to the entry thereof into the processing module 30.

Since the actual measurement value during the temperature rise is substantially equal to the simulation result and the reliability of the simulation result is thus high. When describing based on the simulation result, the relationships between the arm elongation rate Gr and the displacement amount are different from each other during the temperature rise and during the temperature drop. The reason for this is presumed as follows. That is, when the wafer W is transferred to the processing module 30 by the substrate transfer mechanism 5, since the fork 51 holding the wafer W enters into the heated processing module 30, the substrate transfer mechanism 5 is heated from the fork 51 side (leading end side of the arm mechanism 52) and its temperature is raised.

On the other hand, when the fork 51 is retreated to the vacuum transfer chamber 31, the entire substrate transfer mechanism 5 is cooled because the vacuum transfer chamber 31 is at a room temperature. As described above, the temperature rises from the leading end side of the arm mechanism 52 during the temperature rise, whereas the entire substrate transfer mechanism 5 is uniformly cooled during the temperature drop. Accordingly, it is estimated that the push-pull amount in the joint parts 530 and 540 changes between the temperature rise and the temperature drop, thereby causing a difference in the displacement amount.

Furthermore, is was found that, in an initial stage of starting the operation of the device, or in the case where the transfer operation of the substrate transfer mechanism 5 resumes after the substrate transfer mechanism 5 waits for a long period of time, when the temperature of the substrate transfer mechanism 5 that is completely cooled down (that is at a room temperature) gradually rises, there is a behavior different from the general one-arm type arm. That is, even if the first and second link mechanisms 53 and 54 are elongated due to slight rising of the temperature from the room temperature in a state which the substrate transfer mechanism 5 is retracted as compared to when the substrate transfer mechanism 5 is placed at the transfer position in the processing module 30, there is a phenomenon that the deviation of the transfer position is smaller for a change in elongation. Therefore, it is difficult to correct the transfer position of the wafer W in the processing module 30 with high accuracy by merely using the measurement value of the rotation angle of the first driving arm 531.

In view of the foregoing, in the present disclosure, time series data of the measurement value of the rotation angle is acquired, a moving average value thereof is obtained, and a correction amount of the rotation angle of the first driving arm 531 is obtained based on it. This will be described in detail below. The correction of the transfer position is performed by executing steps S1 to S3 described above. First, a measurement value (encoder value) of the rotation angle of the first driving arm 531 when the kicker member 58 is detected by the holding body detection part 6 is acquired at a preset time interval. The preset time interval is, for example, a timing at which the fork 51 of the substrate transfer mechanism 5 enters the load lock chambers 41 and 43 from the vacuum transfer chamber 31, and is, for example, a one-minute interval. The preset time interval is set according to a recipe condition, and it cannot be said that the preset time interval is necessarily constant.

Then, a moving average of a preset sampling number is obtained based on the obtained time series data of the encoder value. For example, assuming that the preset sampling number is, e.g., 25, for example, a memory area for moving average calculation is formed in the controller 7, as will be described later, an average value of 25 encoder values written in the memory area is acquired, which is taken as the moving average value.

For example, when the number of time-series data is less than the preset sampling number in the initial stage of starting the operation of the substrate transfer mechanism 5 at a room temperature, a reference encoder value or a value close to the encoder value is assigned as an encoder value for the insufficient sampling number. The value close to the reference encoder value refers to the reference encoder value, for example, a value of +0.2% or less.

Figure 7:
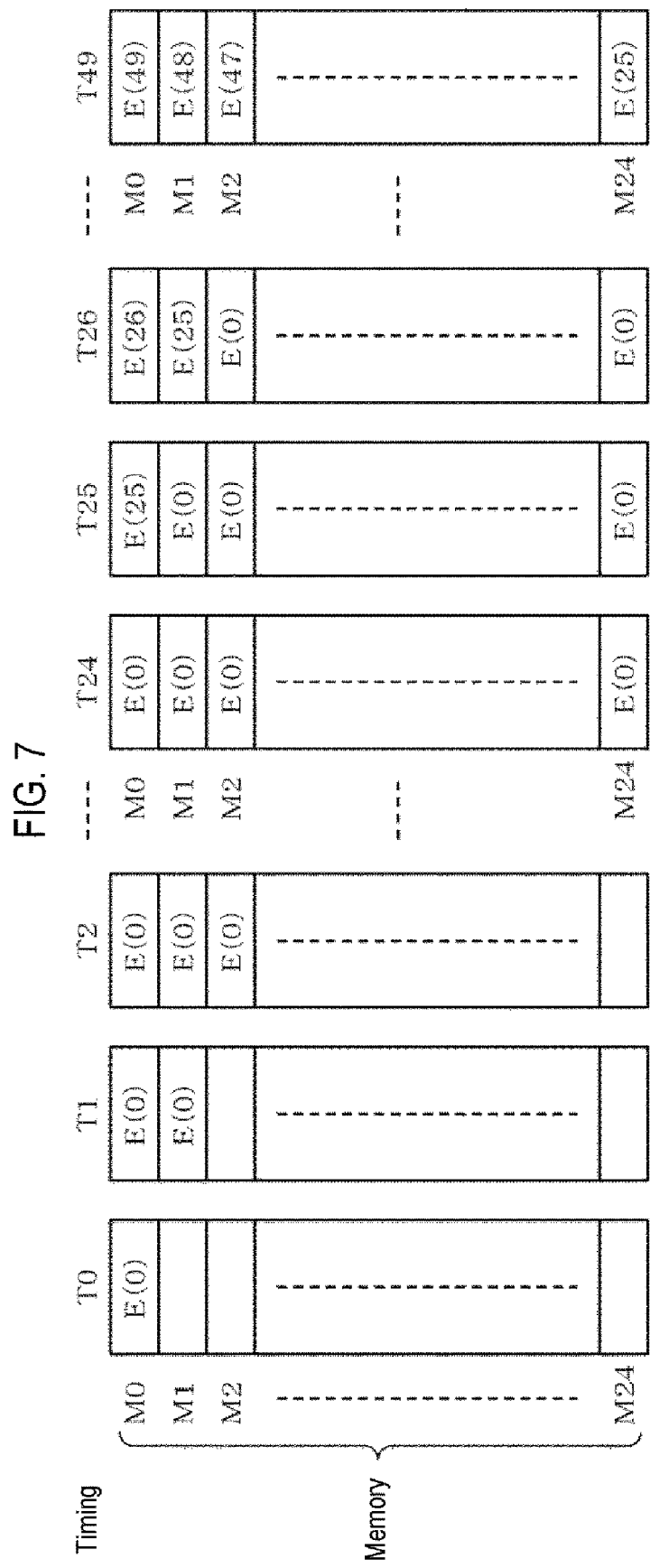
FIG. 7 is a characteristic diagram illustrating time series data of measurement values of a rotational angle of a driving arm.

Specifically, a case where the operation of the substrate transfer mechanism 5, which is dropped to the reference temperature (room temperature) by way of the idling state, starts, the number of samplings is zero (the number of insufficient sampling is 25), and the values close to the reference encoder value are assigned as the encoder value will be described as an example with reference to FIG. 7. Assuming that a time when the fork 51 of the substrate transfer mechanism 5 goes to take the wafer W into the load lock chamber 41 (43) and when the kicker member 58 is detected by the holding body detection part 6 for the first time after the start of operation is T0, an encoder value at T0 is read and the loading position in the processing module 30 is corrected using the encoder value E(0). At this time, as illustrated in FIG. 7, E(0) is written in an address M0 of the memory area for moving average calculation. At next detection timing T1, the encoder value is read, but that value is ignored, the loading position is corrected using E(0), E(0) is written in an address M1 of the memory area for moving average calculation. The same process is carried out till detection timing T24.

Since the initial stage of starting the operation of the substrate transfer mechanism 5 is at a temperature close to the room temperature which is the reference temperature, no elongation occurs in the arm mechanism 52. Thus, the encoder value becomes the reference encoder value. However, for example, when considering a case where it is not completely lowered to the room temperature, there may be a case where the encoder value is slightly different from the reference encoder value. For this reason, the encoder value E(0) at T0 is needed to be obtained. The encoder value E(0) at T0 becomes a value of, for example, a reference rotation angle (reference encoder value)+0.2% or less because the substrate transfer mechanism 5 is at a temperature close to the reference temperature. Thus, with respect to the detection timings T0 to T24, which correspond to the initial stage of starting the operation, the first encoder value E(0) is written in addresses M0 to M24 of the memory area for moving average calculation, and the moving average value which is an average of those values becomes E(0). The initial stage of starting the operation indicates, for example, 15 minutes after the start of the operation.

Then, for 26th detection timing T25, an actual encoder value E(25) is written and a moving average value is acquired. Detection timing T26 and subsequent timings are similarly processed to the detection timing T25. After detection timing T49, all actually measured encoder values are written in the addresses M0 to M25, and based on this, a moving average value is obtained.

Next, in step S3, a correction amount of the rotation angle of the first driving arm 531 obtained in advance is obtained so that the transfer position of the wafer W becomes the reference position, according to a result of comparison between the obtained moving average value and the reference encoder value. The comparison result between the moving average value and the reference encoder value indicates, for example, a difference in rotation angle. Then, as illustrated in FIGS. 3B and 3C, the correction amount is obtained, for example, based on the difference in the rotation angle, a distance L1 from the rotation center A (the center A of the central hub 50) of the substrate transfer mechanism 5 to the predetermined position, and a distance L0 from the rotation center A of the substrate transfer mechanism 5 to the kicker member 58 when the fork 51 is located at the reference position of the wafer W.

The reason for this is that the rotation center A of the substrate transfer mechanism 5 and the distance to the reference position of the wafer W in the plurality of processing modules 30 may differ for each processing module 30. Therefore, since the amount of change in sin θ with respect to a change in rotation angle θ is different, for example, coefficients are obtained in advance from experiments according to the distance L0, and the correction amount of the rotation angle of the first driving arm 531 obtained in advance is obtained using the coefficients so that the transfer position of the wafer W becomes the reference position. Therefore, the controller 7 stores the coefficients obtained by the distance L0 and the distance L1 in advance for each processing module 30. Furthermore, in this example, the distances L1 from the rotation center A (the center A of the central hub 50) of the substrate transfer mechanism 5 to the predetermined portions is equal to each other between the load lock chamber 41 and the load lock chamber 43.

In this manner, the rotation angle of the first motor 55 that drives the first driving arm 531 and the second motor 56 that drives the second driving arm 541 is corrected using the obtained correction amount. Then, when the substrate transfer mechanism 5 transfers the wafer W to the corresponding processing module 30, it transfers the wafer W to the processing module 30 by correcting the transfer position. Next, when the substrate transfer mechanism 5 again goes to take the wafer W into the load lock chamber 41 (43), as already described, it transfers the wafer W to the processing module 30 by reading the encoder value of the first motor 55, obtaining a moving average value, acquiring a correction amount, and correcting the transfer position using this correction amount.

According to the aforementioned embodiment, when transferring the wafer W to the processing module 30 by the so-called frog-leg type substrate transfer mechanism 5, the moving average of the encoder values of the driving arm is obtained, and based on it, and the correction amount of the rotation angle of the driving arm is obtained so that the transfer position of the substrate with respect to the processing module 30 becomes the reference position. Since the link mechanisms are bilaterally symmetrically installed, the correspondence relationship between the measurement value of the rotation angle of the driving arm and the elongation of the arm is different between the temperature rise and the temperature drop. Accordingly, by taking the moving average, the thermal history of the substrate transfer mechanism 5 can be reflected and the reliability of the correction amount is increased. Thus, it is possible to transfer the wafer W to the transfer position of the wafer W in the processing module 30 with high accuracy. If the moving average value is not taken, as will also become apparent from examples which will be described later, the biasing of the displacement amount that the transfer position of the wafer W is displaced from the reference position becomes large in the initial stage of starting the operation of the substrate transfer mechanism 5 at a room temperature.

Furthermore, when the number of time series data is less than a preset sampling number in the initial stage of starting the operation of the substrate transfer mechanism 5 at a room temperature, a reference encoder value or a value close to the reference encoder value is assigned as an encoder value for an insufficient sampling number. In the initial stage of starting the operation of the substrate transfer mechanism 5, as illustrated in FIG. 6, the displacement amount with respect to the arm elongation rate is small, but by assigning the reference encoder value or the value close to the reference encoder value as the encoder value for the insufficient sampling number, the correction amount becomes small by converting the arm elongation rate to a small value, thereby suppressing the biasing of the displacement amount.

In the above description, even when the reference encoder value is assigned as the encoder value for the insufficient sampling number, it is performed in the same manner as described above. In addition, the aforementioned example is merely an example, and the detection timing T0 may be filled with the reference encoder value or a value close to the reference encoder value, and after the detection timing T1, the actually measured encoder value may be written.

Furthermore, after the substrate transfer mechanism 5 is retracted from the interior of the processing module 30 and waits, when the substrate transfer mechanism 5 which is in a temperature state higher than the room temperature resumes the transfer operation, if there is no waiting time-series data, the value obtained based on the encoder value acquired before waiting may be assigned as the time series data. The encoder value acquired before waiting may be the one obtained from, for example, the simulation result illustrated in FIG. 6.

In the above description, the shape and installation position of the kicker member 58 forming the specific portion of the fork 51 are not limited to the aforementioned example, and the shape and installation position of the holding body detection part 6 are not limited to the aforementioned example. Furthermore, a through hole is formed as the specific portion of the fork 51, and when the optical axis passes through the through hole, it is detected that the specific portion is located at the predetermined position and the rotation angle of the driving arm may be obtained. In addition, in the step of obtaining the correction amount based on the comparison result between the moving average value of the rotation angle and the reference rotation angle, the correction amount may be obtained based on the ratio of the moving average value and the reference rotation angle (elongation percentage of the arm), instead of obtaining the correction amount based on the difference in the rotation angle. Furthermore, in the aforementioned example, as the rotation angle of the driving arm, the rotation angle of the first driving arm 531 is obtained, but it may be the rotation angle of the second driving arm 541, or the rotation angles of both the first driving arm 531 and the second driving arm 541 may be acquired.

Moreover, the substrate transfer mechanism 5 is not limited to the configuration illustrated in FIG. 2, and the present disclosure may be applied to a substrate transfer mechanism in which two link mechanisms including a driving arm and a driven arm connected to each other so as to horizontally rotate are symmetrically arranged, a holding body is connected to a leading end of each driven arm so as to horizontally rotate, and the holding body that holds a substrate is advanced and retreated by horizontally rotating the left and right driving arms synchronously by a driving part. Furthermore, the substrate processing of the present disclosure is not limited to the vacuum processing, but may be applied to a substrate processing apparatus including a processing module for processing a substrate in a heated state and a substrate transfer mechanism for transferring the substrate to the processing module.

(Evaluation Tests)

Figure 8:
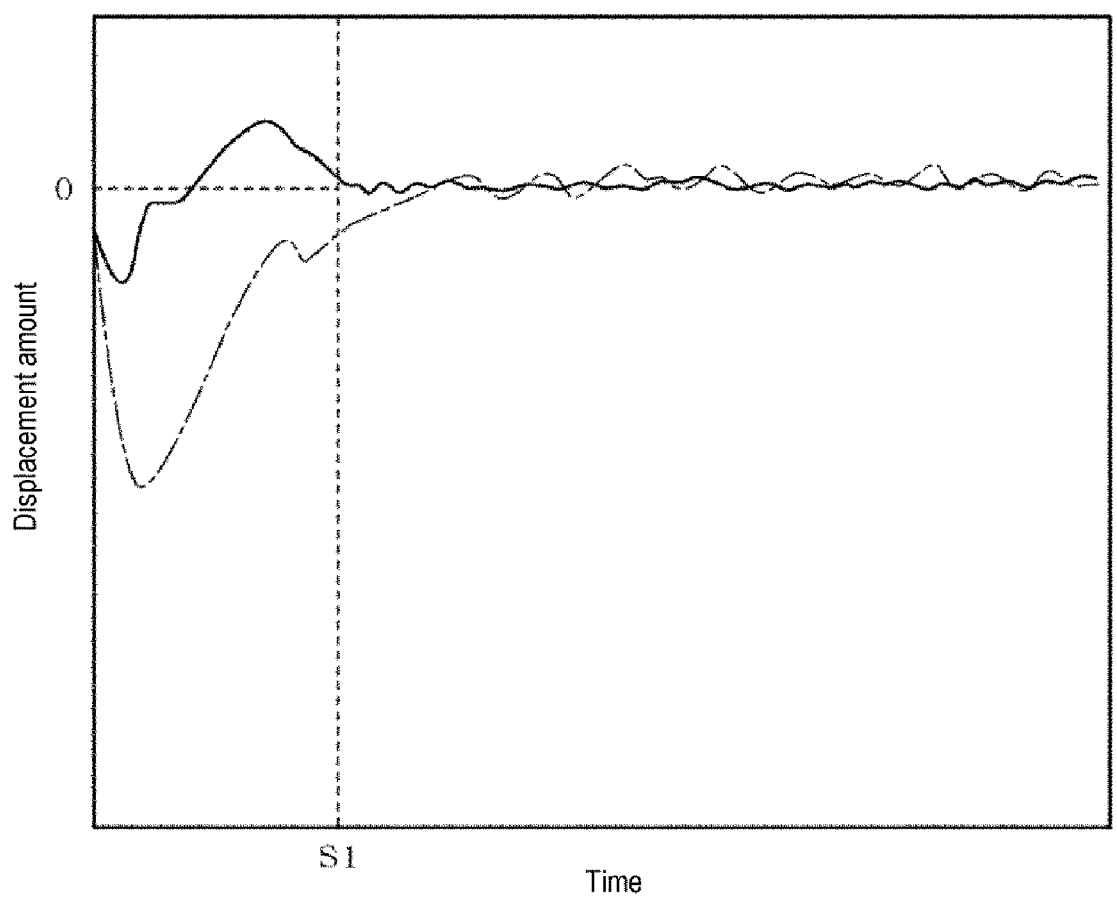
FIG. 8 is a characteristic diagram illustrating a result of an evaluation test.

Actually, data for a case where, in the substrate processing apparatus 1, the operation of the substrate transfer mechanism 5 at a room temperature starts, the moving average is obtained for the measurement value of the rotation angle of the first driving arm 531 when the kicker member 58 of the fork 51 is detected by the holding body detection part 6 and the correction is performed as described above, are indicated in FIG. 8. In FIG. 8, the solid line indicates data obtained by obtaining the moving average value of 25 samples and correcting the transfer position of the wafer W. In FIG. 8, the one-dot chain line indicates data obtained by performing the correction without obtaining the moving average value. In FIG. 8, the horizontal axis indicates time and the vertical axis indicates a displacement amount of the transfer position of the wafer W.

As a result, although the data was biased at the start of the operation of the substrate transfer mechanism 5, it was recognized that the displacement amount converges over time. This is because the temperature change is remarkable and the elongation of the arm occurs as the substrate transfer mechanism 5 is heated to raise the temperature at the start of the operation, but no further elongation of the arm occurs as the arm converges to a certain temperature over time. Furthermore, it is understood that the correction based on the moving average value is particularly effective in the initial stage of starting the operation from the start of the operation to time S1, and by performing this correction, the biasing of the displacement amount at the start of the operation becomes small. On the other hand, when the correction is made without acquiring the moving average value, it is recognized that the displacement amount at the start of the operation is greatly away from 0, which indicates a large displacement amount. Thus, it is understood that the correction based on the moving average value of the present disclosure is effective.

According to the present disclosure in some embodiments, in transferring a substrate to a processing module by a so-called frog-leg type substrate transfer mechanism in which two link mechanisms including a driving arm and a driven arm are symmetrically arranged, a moving average of a measurement value of a rotation angle of the driving arm is obtained and a correction amount of the rotation angle of the driving arm is obtained based on it so that a transfer position of the substrate with respect to the processing module becomes a reference position. By taking the moving average, the thermal history of the substrate transfer mechanism can be reflected and the reliability of the correction amount is increased. Thus, it is possible to transfer the substrate to the transfer position of the substrate in the processing module with high accuracy.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a substrate transfer mechanism configured to advance and retreat a holding body that holds a substrate by bilaterally symmetrically arranging two link mechanisms each including a driving arm and a driven arm connected to each other so as to horizontally rotate, connecting the holding body at a leading end of each of the driven arms of the link mechanisms so that the holding body horizontally rotates, and horizontally rotating the driving arms synchronously by a driving part;
a processing module configured to process the substrate in a heated state, the substrate being transferred by the substrate transfer mechanism;
a rotation angle measuring part configured to measure a rotation angle of at least one of the driving arms;
a holding body detection part configured to detect that a specific portion of the holding body is located at a predetermined position; and
a controller configured to execute a step of acquiring a measurement value of the rotation angle of at least one of the driving arms when the specific portion is detected by the holding body detection part by positioning the specific portion of the holding body at the predetermined position at preset time intervals, a step of obtaining a moving average of a preset sampling number for the measurement value of the rotation angle based on time series data of the measurement value of the rotation angle acquired in the step of acquiring the measurement value, and a step of obtaining a correction amount of the rotation angle of at least one of the driving arms obtained in advance so that a substrate transfer position of the holding body of the substrate transfer mechanism for the processing module becomes a reference position, according to a comparison result between a value of the moving average and a value of a reference rotation angle which is a rotation angle of at least one of the driving arms when the specific portion of the holding body of the substrate transfer mechanism at a reference temperature is located at the predetermined position.

2. The apparatus of claim 1, wherein the step of obtaining the correction amount obtains the correction amount by being further based on a distance from a rotation center of the substrate transfer mechanism to the predetermined position, and a distance from the rotation center of the substrate transfer mechanism to the specific portion when the holding body is located at the substrate transfer position, in addition to the comparison result between the value of the moving average and the value of the reference rotation angle.

3. The apparatus of claim 1, wherein the reference temperature is a room temperature.

4. The apparatus of claim 3, wherein when a number of time series data is less than the preset sampling number in an initial stage of starting the operation of the substrate transfer mechanism at the room temperature, the reference rotation angle or a value close to the reference rotation angle is assigned as a measurement value of a rotation angle for an insufficient sampling number.

5. The apparatus of claim 1, wherein after the substrate transfer mechanism is retracted from the processing module and waits, when the substrate transfer mechanism which is in a temperature state higher than a room temperature resumes a transfer operation, if there is no waiting time series data, a value obtained based on the measurement value of the rotation angle acquired before the substrate transfer mechanism waits is assigned as the time series data.

6. The apparatus of claim 1, further comprising a load lock chamber configured to be switched between a normal pressure atmosphere and a vacuum atmosphere and having a loading part on which the substrate is loaded; and
    a vacuum transfer chamber which is airtightly connected to the load lock chamber and in which the substrate transfer mechanism is disposed,
    wherein the processing module is further configured to perform vacuum processing on the substrate and is airtightly connected to the vacuum transfer chamber.

7. A method of operating a substrate processing apparatus including a substrate transfer mechanism configured to advance and retreat a holding body that holds a substrate by bilaterally symmetrically arranging two link mechanisms each including a driving arm and a driven arm connected to each other so as to horizontally rotate, connecting the holding body at a leading end of each of the driven arms of the mechanisms so that the holding body horizontally rotates, and horizontally rotating the driving arms synchronously by a driving part; and a processing module configured to process the substrate in a heated state, the substrate being transferred by the substrate transfer mechanism, the method comprising:
    acquiring a measurement value of a rotation angle of at least one of the driving arms when a specific portion of the holding body is detected by a holding body detection part by positioning the specific portion of the holding body at the predetermined position at preset time intervals;
    obtaining a moving average of a preset sampling number for the measurement value of the rotation angle based on time series data of the measurement value of the rotation angle acquired in the step of acquiring the measurement value; and
    obtaining a correction amount of the rotation angle of at least one of the driving arms obtained in advance so that a substrate transfer position of the holding body of the substrate transfer mechanism for the processing module becomes a reference position, according to a comparison result between a value of the moving average and a value of a reference rotation angle which is a rotation angle of at least one of the driving arms when the specific portion of the holding body of the substrate transfer mechanism at a reference temperature is located at the predetermined position.

\* \* \* \* \*